United States Patent
Lee et al.

(10) Patent No.: US 8,339,559 B2
(45) Date of Patent: Dec. 25, 2012

(54) LIQUID CRYSTAL DISPLAY UNIT STRUCTURE INCLUDING A PATTERNED ETCH STOP LAYER ABOVE A FIRST DATA LINE SEGMENT

(75) Inventors: Liu-Chung Lee, Hsinchu (TW); Hsiang-Lin Lin, Hsinchu (TW); Kuo-Yu Huang, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 13/466,195

(22) Filed: May 8, 2012

(65) Prior Publication Data

US 2012/0218489 A1    Aug. 30, 2012

Related U.S. Application Data

(62) Division of application No. 12/274,775, filed on Nov. 20, 2008, now Pat. No. 8,199,303.

(30) Foreign Application Priority Data

Dec. 28, 2007   (TW) ................................ 96150764 A

(51) Int. Cl.
*G02F 1/136* (2006.01)
*G02F 1/1333* (2006.01)
*G02F 1/1343* (2006.01)
*H01L 29/04* (2006.01)
*H01L 29/10* (2006.01)
*H01L 31/00* (2006.01)
*H01L 27/14* (2006.01)
*H01L 29/15* (2006.01)
*H01L 31/036* (2006.01)

(52) U.S. Cl. .......... 349/142; 349/43; 349/122; 349/138; 349/139; 349/147; 257/59; 257/72

(58) Field of Classification Search .................... 349/42, 349/43, 46, 122, 138–140, 142, 147; 257/59, 257/72
See application file for complete search history.

(56) References Cited

U.S. PATENT DOCUMENTS 5,920,082 A * 7/1999 Kitazawa et al. ............... 257/59
(Continued)

FOREIGN PATENT DOCUMENTS

JP    2001-021919    1/2001

OTHER PUBLICATIONS

English language translation of abstract of JP 2001-021919.

*Primary Examiner* — Mark Robinson
*Assistant Examiner* — Paisley L Arendt
(74) *Attorney, Agent, or Firm* — McClure, Qualey & Rodack, LLP

(57) ABSTRACT

A liquid crystal display unit structure and the manufacturing method thereof are provided. The liquid crystal display unit structure comprises a patterned first metal layer with a first data line segment and a gate line on a substrate; a patterned dielectric layer covering the first data line and the gate line having a plurality of first openings and a second opening therein, a patterned etch stop layer having a first portion located above the first data line segment and a second portion; a patterned second metal layer including a common electrode line, a second data line segment, a source electrode and a drain electrode, wherein the first portion of the patterned etch stop layer is between the first data line segment and the common line; a patterned passivation layer and a patterned transparent conductive layer.

10 Claims, 19 Drawing Sheets

U.S. PATENT DOCUMENTS

| | | | | |
|---|---|---|---|---|
| 6,043,859 A * | 3/2000 | Maeda | | 349/143 |
| 7,167,217 B2 | 1/2007 | Yun | | |
| 7,202,500 B2 | 4/2007 | Yoo et al. | | |
| 2007/0004069 A1 | 1/2007 | Cho et al. | | |
| 2007/0171320 A1 | 7/2007 | Lin | | |
| 2008/0044982 A1 | 2/2008 | You | | |

* cited by examiner

LIQUID CRYSTAL DISPLAY UNIT STRUCTURE INCLUDING A PATTERNED ETCH STOP LAYER ABOVE A FIRST DATA LINE SEGMENT

CROSS-REFERENCES TO RELATED APPLICATIONS

This is a divisional application of patent application Ser. No. 12/274,775 filed on Nov. 20, 2008, now U.S. Pat. No. 8,199,303. The prior application Ser. No. 12/274,775 claims the benefit of Taiwan Patent Application No. 096150764 filed on Dec. 28, 2007, the disclosures of which are incorporated herein by reference in their entirety.

BACKGROUND OF THE INVENTION

1. Field of the Invention

The present invention relates to a method of manufacturing a liquid crystal display unit; and more particularly, the present invention relates to a method of manufacturing a liquid crystal display unit for use in a liquid crystal display.

2. Descriptions of the Related Art

Conventionally, thin-film transistor liquid crystal displays (TFT-LCDs) have had inadequate brightness levels and a high power consumption of backlight sources thereof. One of the parameters that affect the light emission of an LCD is the aperture ratio of pixels, which is defined as the ratio of a light-transmissive area to the pixel area of a pixel. Accordingly, the design of the pixel aperture ratio has a direct influence on both the utilization of the backlight source and the brightness of the LCD. Therefore, over recent years, it is important to improve the aperture ratio (i.e., how to increase the aperture ratio) of a pixel. New technologies for improving the aperture ratio of an LCD are also being developed in this field to obtain an LCD with low power consumption but a high brightness.

In the design of a TFT-LCD, a conventional method for increasing the aperture ratio is to enlarge the area of the pixel electrode (typically a transparent conductive electrode made of, e.g., Indium Tin Oxide) and have it overlapped with the source/drain circuit. This may lead to an increase of about 10%~20% in the aperture ratio. However, this makes the pixel electrode closer to the data line. If the pixel electrode is disposed too close to the data line, a capacitor Cpd with excessive parasitic capacitance would be formed therebetween. The impact of the parasitic capacitor Cpd will be further described hereinbelow.

In typical TFT elements, a dielectric material of a relatively high dielectric constant (e.g., a SiNx film) is often provided between the pixel electrode and the data line. The relatively high dielectric constant may cause an increase in the Cpd. If the capacitance value of the parasitic capacitor Cpd goes excessively high, the fully charged pixel electrode may incur cross talk prior to transitioning to the next frame under the influence of different voltages transferred on the data line. The electrical characteristics brought about by the cross talk may cause error in the output, and the consequent parasitic effect may seriously impair the integrity of the signals, causing error in the image displayed and poorer display quality of the TFT-LCD.

Up to now, a number of methods for mitigating the effect of the parasitic capacitor Cpd have been proposed in this field, one of which is illustrated in FIG. 1. As shown, a common electrode line 103, a dielectric layer 105, a data line 107, a passivation layer 109 and a pixel electrode 111 are disposed on the substrate 101. A storage capacitor Cs is formed between the common electrode line 103 and the pixel electrode 111. A parasitic capacitor Cpd exists between the pixel electrode 111 and the data line 107. The passivation layer 109 in this structure enlarges the distance between the common electrode line 103 and the pixel electrode 111 to weaken the effect of the parasitic capacitor Cpd.

However, the structure illustrated in FIG. 1 also leads to an enlarged distance between the common electrode line 103 and the pixel electrode 111. Consequently, the storage capacitor Cs between the common electrode line 103 and the pixel electrode 111 is decreased in value, which necessitates the enlargement of the surface area of the electrodes associated with the storage capacitor for the total storage capacitor Cst to remain unchanged. As a result, the enlargement of the electrode surface area implies a decrease in the aperture ratio. Furthermore, the additional passivation layer 109 renders the manufacturing process more complex and adds to the production cost. In a specific embodiment of this method, the resulting black matrix (not shown) above the data line 107 has a width larger than 20 micrometers (μm).

Alternatively, a consistent electric field shield may be provided between the pixel electrode and the data line to decrease the parasitic capacitance therebetween. In typical shielding approaches, a metal shield is often used to clad the conductive line in expectation of an electric field shielding effect. However, because the metal shield is disposed too close to the conductive lines, charge accumulation tends to occur on the metal shield due to the electric field coupling between the metal shield and the conductive line. Hence, the metal shield has to be grounded or connected to a constant voltage to obviate the charge accumulation thereon while still serving a shielding function.

FIG. 2 depicts a structure with a metal shield and a high aperture ratio. In this structure, a first insulating layer 203, a second insulating layer 205, a data line 207, a third insulating layer 209, a pixel electrode 211, and a storage electrode 213 are disposed on a substrate 201. The storage electrode 213, which is at a common potential, is interposed between the data line 207 and the pixel electrode 211 and configured to shield the effect of the parasitic capacitor Cpd between the data line 207 and the pixel electrode 211. This method imposes less impact on the aperture ratio, and in the specific embodiment of this method, the width of the resulting black matrix (not shown) above the data line 207 is decreased to 10 μm. However, as compared to typical pixel structures, this method requires an additional insulating layer and an additional metal layer to shield the electrode. This renders the manufacturing process more complex and adds to both the production duration and cost.

There are also other means for decreasing the parasitic capacitor Cpd. For example, the storage capacitor can be increased to decrease the proportion of the parasitic capacitor Cpd that accounts for the total capacitor $C_{total}$ of a sub-pixel unit. However, if the storage capacitor is to be increased in size, the area of the opaque electrodes associated with the storage capacitor has to be increased, which will adversely affect the aperture ratio. Another method is to coat a low-k organic insulator film (K=2.7~3.5) on appropriate locations through a photo-imaging and an SOG process to weaken the effect of the parasitic capacitor between the data line and the pixel electrode or even to overlap the pixel electrode with the data line. However, the drawbacks of the low-k organic insulator film such as water absorption, yellowed and poor interface adhesion may have an adverse impact on the production yield and throughput. Alternatively, during the design of the pixel, a distance larger than a certain value may be kept between the pixel electrode and the data line. However, the aperture ratio is compromised as the distance gets larger, although the effect of the parasitic capacitor Cpd is weakened accordingly.

Although the aforesaid methods may weaken the effect of the parasitic capacitor Cpd, there are still many drawbacks. For example, they have adverse impact on the aperture ratio, render the manufacturing process complex, and add to both production time and cost. Therefore, it is still important to overcome the effect of the parasitic capacitor Cpd between the data line and the pixel electrode. In view of this, it is highly desirable in the art to provide a method for manufacturing a liquid crystal display unit that can weaken the effect of the parasitic capacitor Cpd.

SUMMARY OF THE INVENTION

This invention obviates the effect of the parasitic capacitor and eliminates the drawbacks such as a complex manufacturing process and added production duration and cost as confronted by the solutions of the prior art.

One objective of this invention is to provide a method for manufacturing a liquid crystal display unit structure, comprising the following steps: forming a patterned first metal layer on a substrate, wherein the patterned first metal layer includes a first data line segment and a lower gate pad; forming a patterned dielectric layer to define a plurality of first openings on the first data line segment and to define a second opening on the lower gate pad; forming a patterned second metal layer including a common electrode line, a second data line segment and a upper gate pad, wherein the upper gate pad is electrically connected to the lower gate pad via the second opening, and the second data line segment is electrically connected to the first data line segment via the first openings; forming a patterned passivation layer; and forming a patterned transparent conductive layer.

Another objective of this invention is to provide a method for manufacturing a liquid crystal display unit structure, comprising the following steps: forming a patterned first metal layer on a substrate, the patterned first metal layer including a gate line, a first data line segment and a lower gate pad; forming a dielectric layer, a semiconductor layer and a photoresist layer sequentially on the substrate; patterning the photoresist layer by using a halftone mask; removing part of the photoresist layer to form a plurality of first openings to expose the surface of the semiconductor layer over two terminals of the first data line segment, and to form at least one second opening to expose the surface of the semiconductor layer over the lower gate pad; removing the exposed semiconductor layer and/or the dielectric layer below the exposed semiconductor layer within the first openings and the second opening; removing part of the photoresist layer to keep at least the residual of the photoresist layer on the gate line; removing the semiconductor layer uncovered by the photoresist layer; removing the residual of the photoresist layer to form a patterned dielectric layer and a patterned semiconductor layer; forming a patterned second metal layer with a common electrode line, a second data line segment and a upper gate pad on the patterned dielectric layer and the patterned semiconductor layer, wherein the second data line segment is electrically connected to the first data line segment via the first openings, and the upper gate pad is electrically connected to the lower gate pad via the second opening; forming a patterned passivation layer; and forming a patterned transparent conductive layer.

Still another objective of this invention is to provide a method for manufacturing a liquid crystal display unit structure, comprising the following steps: forming a first data line segment and a patterned dielectric layer covering the first data line segment on a substrate, wherein the patterned dielectric layer has a plurality of first openings that are located on the two terminals of the first data line segment; forming a patterned semiconductor layer on the substrate; forming a second data line segment and a common electrode line on the patterned semiconductor layer, wherein the second data line segment is electrically connected to the first data line segment via the first openings; forming a patterned passivation layer; and forming a patterned transparent conductive layer.

Yet a further objective of this invention is to provide a method for manufacturing a liquid crystal display unit structure, comprising the following steps: forming a first data line segment and a dielectric layer covering the first data line segment on a substrate; forming a first semiconductor layer; forming an etch stop layer on the first semiconductor layer located above the first data line segment; forming a second semiconductor layer on the first semiconductor layer and the etch stop layer; exposing the first data line segment at the two terminals thereof, and patterning the dielectric layer, the first semiconductor layer and the second semiconductor layer by etching the dielectric layer, the first semiconductor layer and the second semiconductor layer to define a plurality of first openings on the dielectric layer; forming a second data line segment and a common electrode line on the patterned second semiconductor layer, wherein the second data line segment is electrically connected to the first data line segment via the first openings; forming a patterned passivation layer; and forming a patterned transparent conductive layer.

Still a further objective of this invention is to provide a liquid crystal display unit structure, comprising the following: a first data line segment formed on a substrate; a patterned dielectric layer formed on the first data line segment; a patterned first semiconductor layer formed on the patterned dielectric layer; a patterned second semiconductor layer formed on the patterned first semiconductor layer; and a common electrode line and a second data line segment formed on the patterned second semiconductor layer, wherein the patterned dielectric layer defines a plurality of first openings on two terminals of the first data line segment for electrically connecting the first data line segment connected to the second data line segment.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
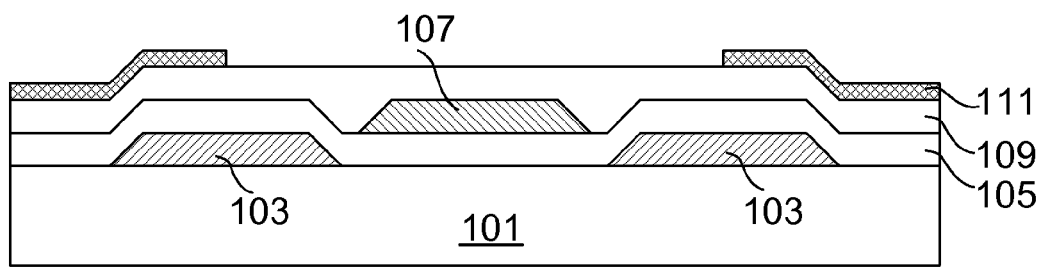
FIG. 1 is a schematic view of a solution of the prior art.
Figure 2:
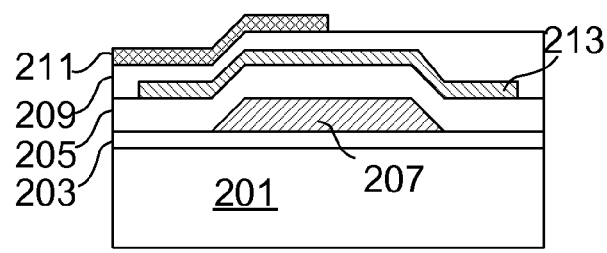
FIG. 2 is a schematic view of another solution of the prior art.
Figure 3A:
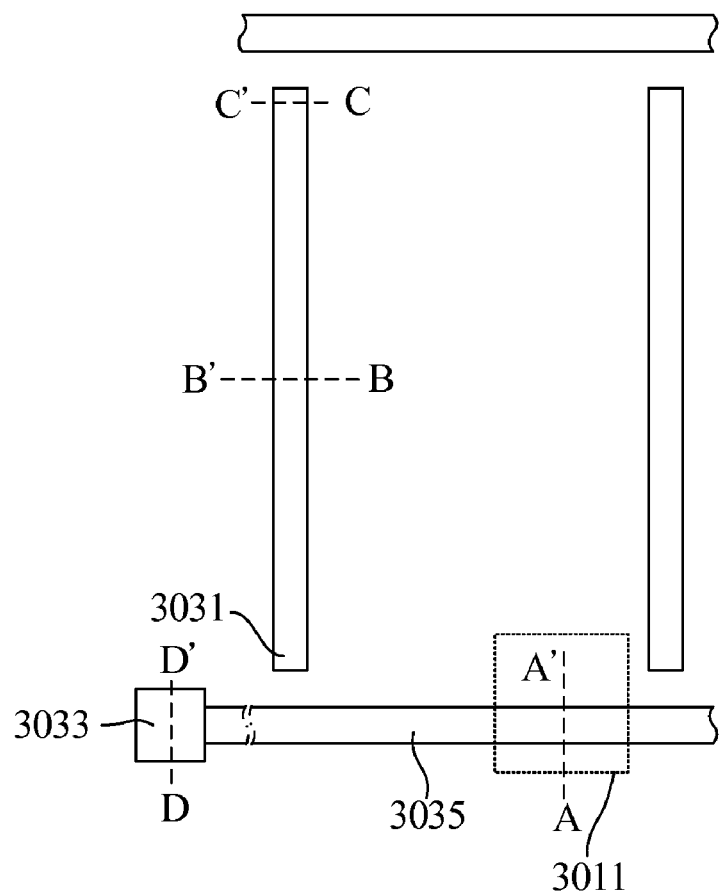
FIGS. 3A to 3N are schematic views of a manufacturing process in accordance with the first embodiment of this invention, wherein FIG. 3E to FIG. 3H schematically illustrate the complete manufacturing process of FIG. 3D by using a halftone mask to perform lithography and etching processes.
Figure 3B:
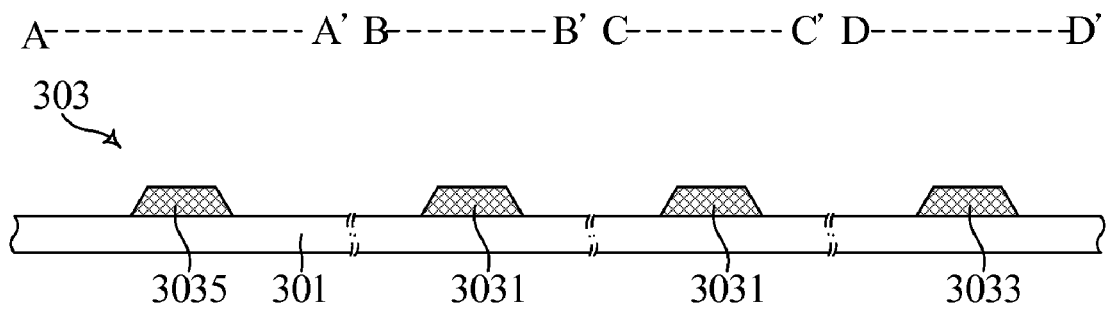
Figure 3C:
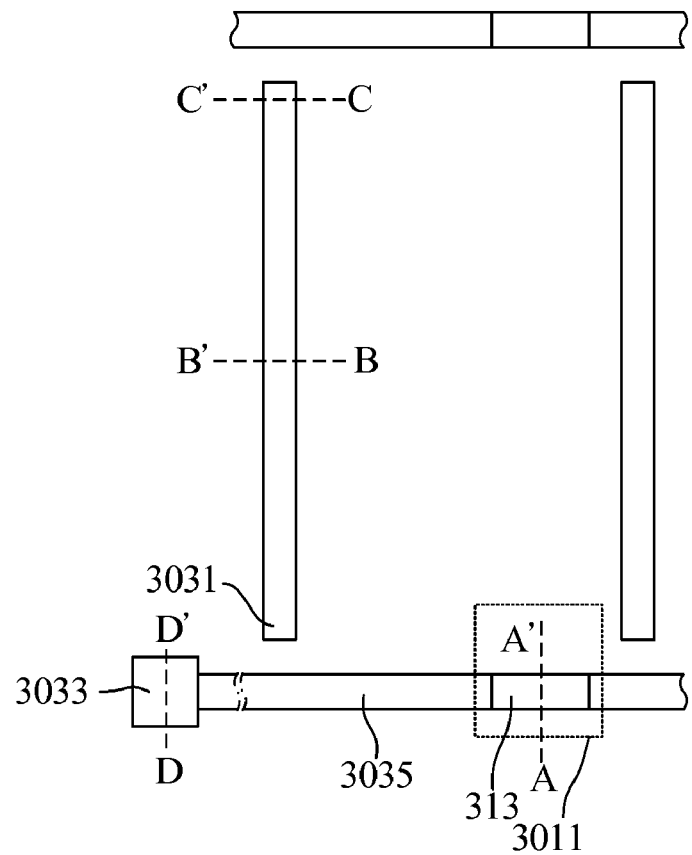
Figure 3D:
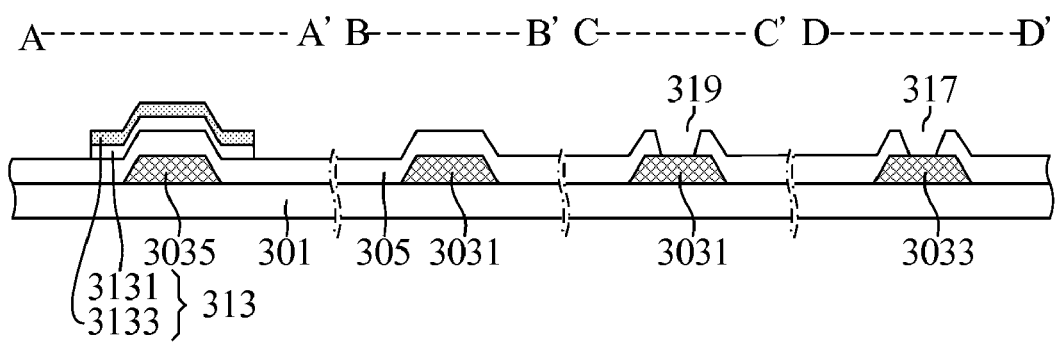
Figure 3E:
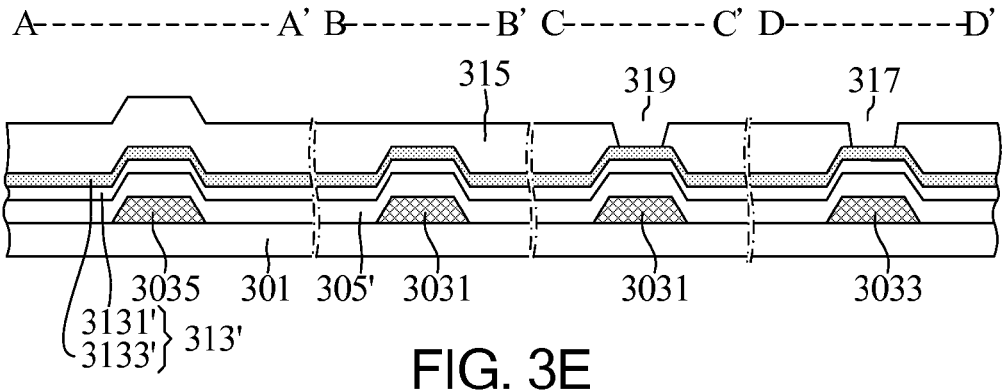
Figure 3F:
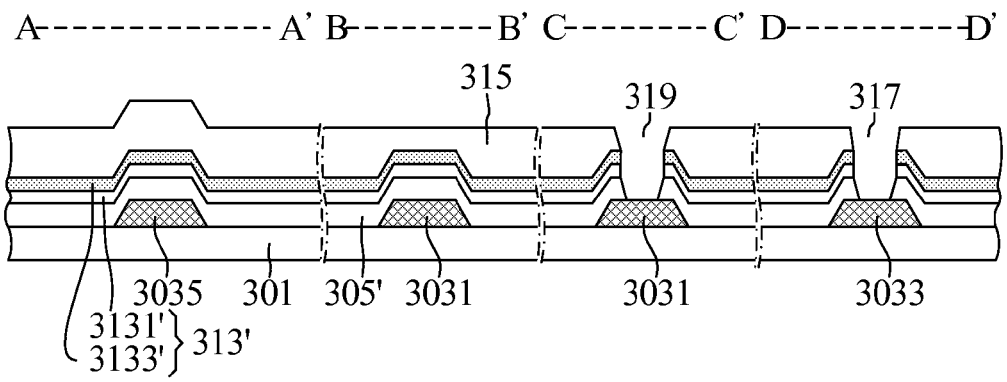
Figure 3G:
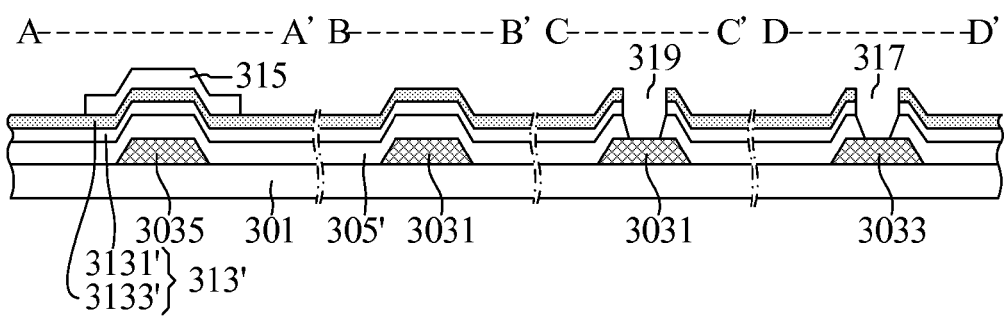
Figure 3H:
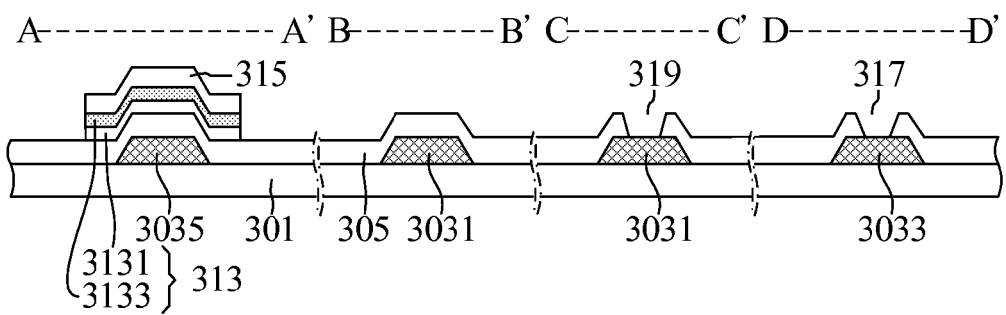
Figure 3I:
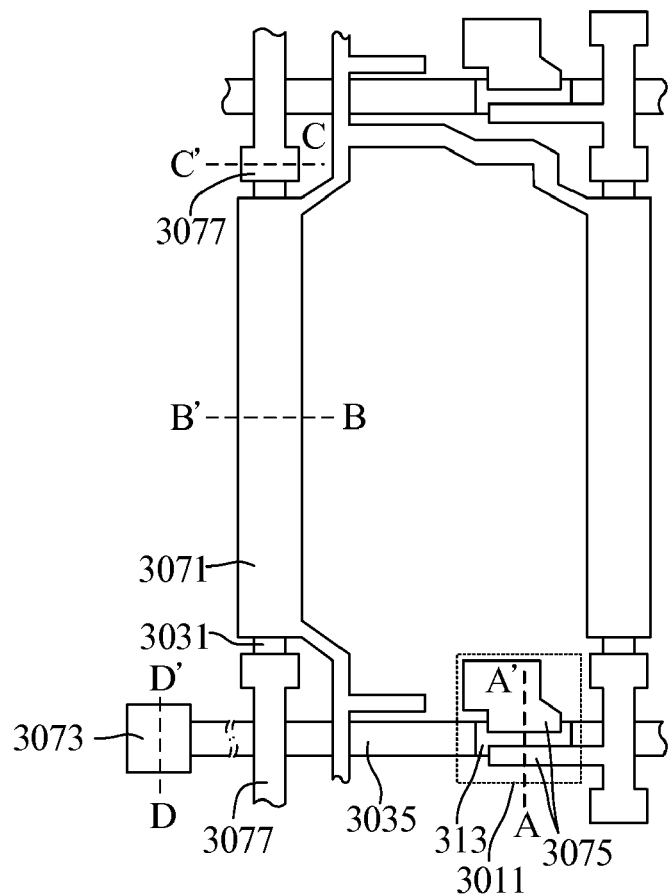
Figure 3J:
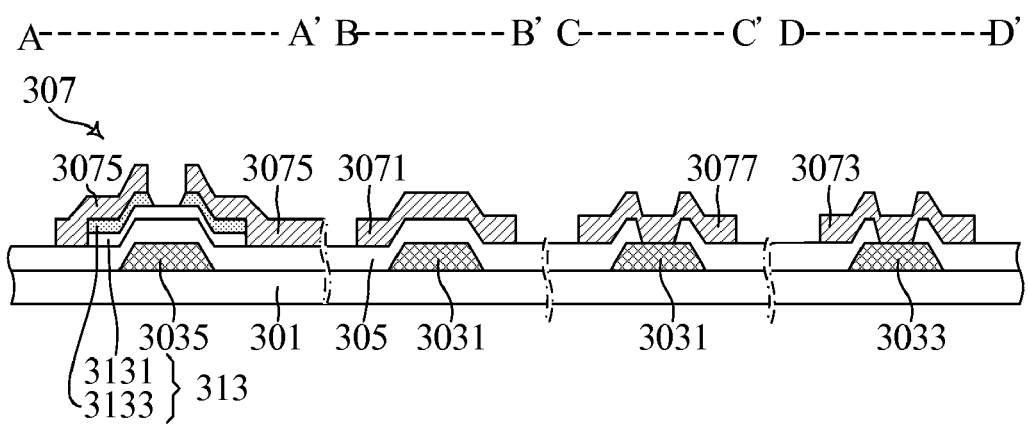
Figure 3K:
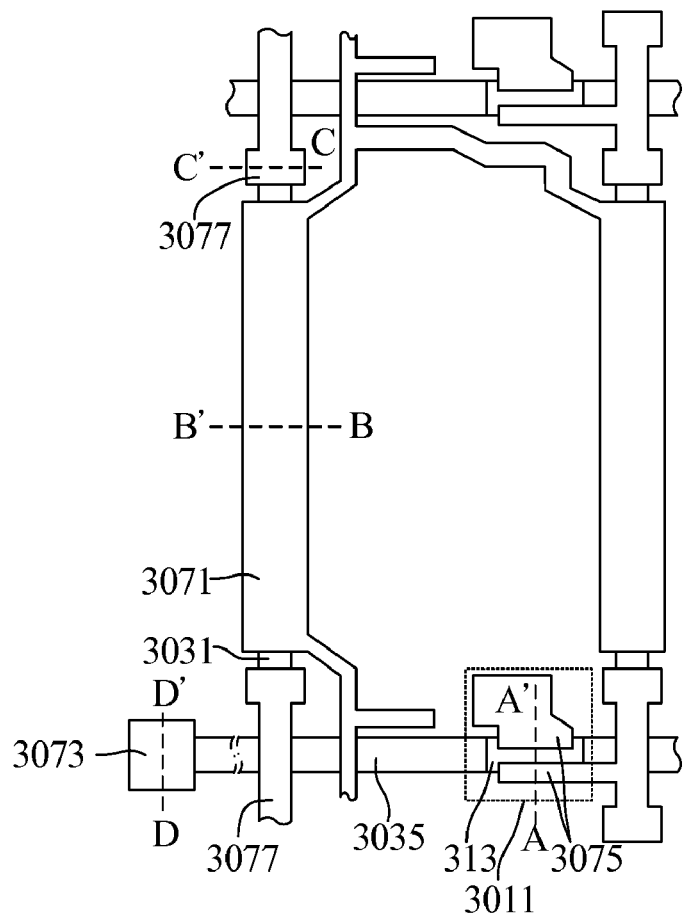
Figure 3L:
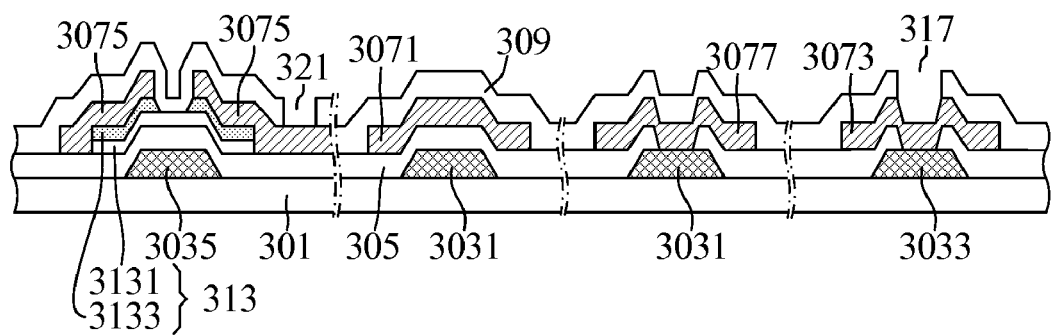
Figure 3M:
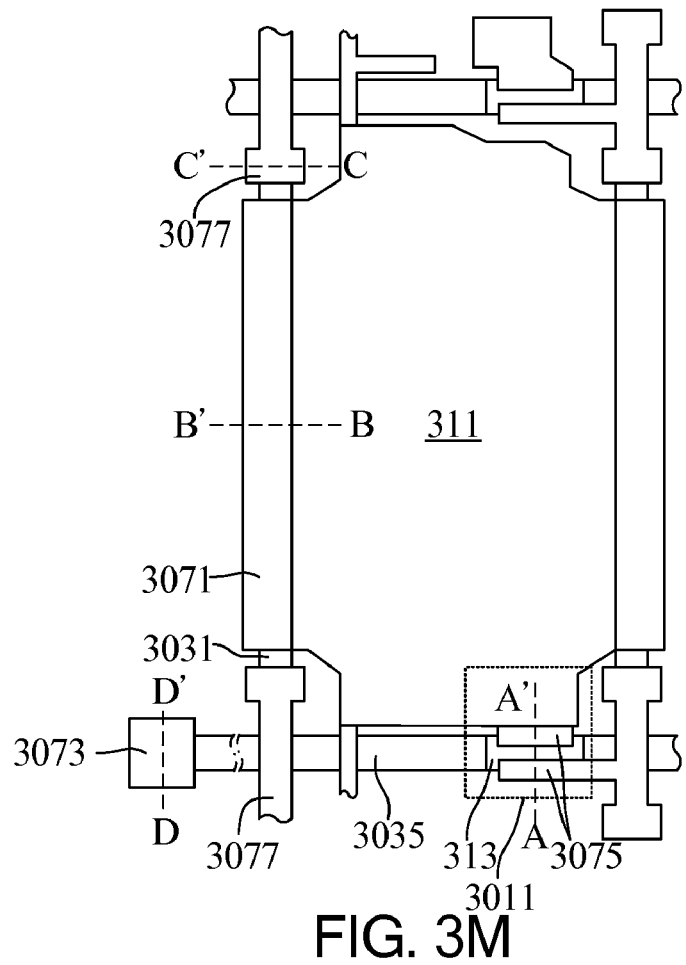
Figure 3N:
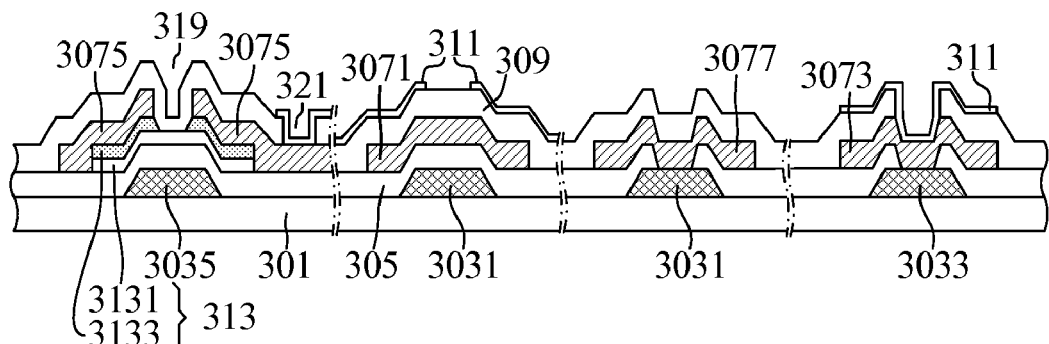

FIGS. 3A to 3N are schematic views of the first embodiment of this invention. FIG. 3A is a top view of FIG. 3B. FIG.

3B is a schematic cross-sectional view taken along the lines AA', BB', CC' and DD' in FIG. 3A. First, in reference to FIG. 3B, a patterned first metal layer 303 is formed on a substrate 301. The substrate 301 is typically a glass substrate, especially glass free of alkali metal ions (e.g., sodium ions, potassium ions and etc.) with a low thermal expansion coefficient. Subsequent to an appropriate cleaning of the substrate 301, a metal material is applied onto the entire substrate 301 through a suitable process, for example, a deposition or sputtering process. Then, unnecessary portions of the metal material are removed through lithography and etching processes, leaving a patterned first metal layer 303 formed on the substrate 301. Alternatively, a patterned first metal layer 303 may be formed directly on the substrate through a printing or a similar process. Those of ordinary skill in the art may appreciate that the patterned first metal layer 303 is not limited to aforementioned formation processes, but may also be formed by other processes depending on the requirements.

Furthermore, depending on the requirements of the manufacturing process, the material of the patterned first metal layer 303 may be selected from a group consisting of molybdenum, tantalum, chromium, tungsten, aluminum, other conductive metals, or alloys thereof The patterned first metal layer 303 may also be incorporated into a multi-layer structure. For example, a barrier layer is provided and the patterned first metal layer 303 is then formed on the barrier layer to avoid diffusion of metal ions into the substrate.

The patterned first metal layer 303 formed as described above comprises a first data line segment 3031, a lower gate pad 3033 and a gate line 3035. The gate line 3035 passes through a transistor region 3011 of the liquid crystal display unit structure and electrically connected with the lower gate pad 3033.

Next, in reference to FIG. 3C and FIG. 3D in which FIG. 3C is a top view of FIG. 3D, a patterned dielectric layer 305 and a patterned semiconductor layer 313 are formed. The patterned dielectric layer 305 comprises a plurality of first openings 319 defined on the first data line segment 3031 to expose the terminals of the first data line segment 3031 and a second opening 317 to expose the lower gate pad 3033. The procedures are as follows. Although this invention may also choose other methods, steps or execution sequences depending on the practical requirements, such as disposing the dielectric material and the semiconductor material in sequence on the entire substrate 301 through a chemical vapor deposition (CVD) process. Then, a patterned dielectric layer 305 and a patterned semiconductor layer 313 are formed through lithography and etching processes, such as the halftone process. The patterned dielectric layer 305 may be made of silicon nitride or other dielectric materials.

In another method, a dielectric material is applied to the entire substrate 301 through a CVD process, and then the unnecessary portions of the dielectric material are removed through lithography and etching processes to form the patterned dielectric layer 305 comprising the first openings 319 and the second opening 317 described above. Subsequently, a semiconductor material is applied to the entire substrate 301 through a CVD process, and the unnecessary portions of the semiconductor material are removed through lithography and etching processes to form the pattern semiconductor layer 313, also as shown in FIG. 3D.

The patterned semiconductor layer 313 is disposed on the patterned dielectric layer 305 in the transistor region 3011 of the liquid crystal display unit structure. Depending on the requirements, the semiconductor layer 313 may be incorporated into a multi-layer structure. In the following description, the patterned semiconductor layer 313 comprising a patterned first semiconductor layer 3131 and a patterned second semiconductor layer 3133 on the patterned first semiconductor layer 3131 will be described as an example. The patterned first semiconductor layer 3131 may be an amorphous-silicon layer, and the patterned second semiconductor layer 3133 may be an N-type ion heavily doped amorphous-silicon layer. The patterned second semiconductor layer 3133 is formed on the patterned first semiconductor layer 3131 by in-situ doped deposition, or by doping N-type ions into the patterned first semiconductor layer 3131 through an implantation, or process of the like. The semiconductor layer described above may be an amorphous-silicon layer or other materials.

Another method to shorten the duration of producing a liquid crystal display panel is to perform the lithography and etching processes by using a half-tone mask to obtain the structure of FIG. 3D with a reduced number of manufacturing processes. FIGS. 3E to 3H depict the method of forming the structure of FIG. 3D by using the half-tone mask to perform the lithography and etching processes. This is described as follows. First, in reference to FIG. 3E, a dielectric layer 305', a semiconductor layer 313' and a pattern photoresist layer 315 are formed in sequence on the substrate 301. The semiconductor layer 313' comprises a first semiconductor layer 3131' and a second semiconductor layer 3133' on the first semiconductor layer 3131'. The pattern photoresist layer 315 is formed by the halftone mask and has three portions with three thicknesses. The first portion of the pattern photoresist layer 315 is located in the transistor region 3011 of the liquid crystal display unit structure and has a thickness higher than the other portions of the pattern photoresist layer 315. The third portion of the patterned photoresist layer 315 is removed at locations where the first openings 319 and the second opening 317 are to be formed, i.e., portions atop the lower gate pad 3033 and portions atop a part of the first data line segment 3031 respectively. Next, as shown in FIG. 3F, an etching process is performed to remove portions of the semiconductor layer 313' exposed through the first openings 319 and the second opening 317. The portions of the dielectric layer 305' within the first openings 319 and the second opening 317 are removed as well to expose the lower gate pad 3033 and the terminals of the first data line segment 3031.

Thereafter, as shown in FIG. 3G, portions of the pattern photoresist layer 315 are further removed through a photoresist removing process. In this step, the first portion of the pattern photoresist layer 315 remains at least above the gate line 3035 in the transistor region 3011 of the liquid crystal display unit structure, and at least the semiconductor layer 313' on the first data line segment 3031 is exposed. Then, as shown in FIG. 3H, the semiconductor layer 313' uncovered by the pattern photoresist 315 is removed to form the patterned semiconductor layer 313. Finally, the residual photoresist layer 315 is removed to form the structure as shown in FIG. 3D.

Next, FIG. 3I is a top view of FIG. 3J. A patterned second metal layer 307, which may be designed either in a display area or in a peripheral circuit area, is formed. The patterned second metal layer 307 thus formed comprises a common electrode line 3071, an upper gate pad 3073, source/drain electrodes 3075 and a second data line segment 3077. The source/drain electrodes 3075 are disposed on a portion of the patterned semiconductor layer 313 above the gate line 3035, and are electrically connected to the overlapped portion of the patterned semiconductor layer 313. Portion of the patterned second metal layer 307 is electrically connected to the patterned first metal layer 303 via the first openings 319 and the second opening 317. In more detail, the first data line segment 3031 is electrically connected to the second data line segment 3077 via the first openings 319, so that the first data line segment 3031 and the second data line segment 3077 form together a data line necessary for the liquid crystal display unit. The upper gate pad 3073 is electrically connected to the lower gate pad 3033 via the second opening 317, so that the gate line 3035 is electrically connected with the upper gate pad 3073. The common electrode line 3071 has a portion parallel to the data line and covering the first data line segment, which serves as a shielding common electrode line. The portion of the common electrode line 3071 covering the first data line segment 3031 has a width larger than a width of the first data line segment 3031.

The processes to form the patterned second metal layer 307 are as follows. Although this invention may also choose other processes, steps or execution sequences depending on practical requirements and is not merely limited thereto: a metal material is applied on the entire surface through a sputtering process, and then the unnecessary portions of the metal layer are removed through lithography and etching processes to form the patterned second metal layer 307. Depending on the requirements in practical applications, the patterned second metal layer 307 may be made of a material identical to or different from that of the patterned first metal layer 303. Additionally, because the patterned semiconductor layer 313 in this embodiment includes the patterned first semiconductor layer 3131 and the patterned second semiconductor layer 3133, a dry etching process or another appropriate process is typically used to etch the patterned second semiconductor layer 3133 above the gate line to further expose the patterned first semiconductor layer 3131.

Next, as shown in both FIG. 3K and FIG. 3L in which FIG. 3K is a top view of FIG. 3L a patterned passivation layer 309 is formed in the following way (but not limited thereto). A dielectric layer is formed on the entire surface through a CVD process. Then, unnecessary portions of the dielectric layer are removed to form the patterned passivation layer 309 through lithography and etching processes. This step includes forming the second opening 317 to expose a portion of the top surface of the upper gate pad 3073 above a lower gate pad 3033, and forming a third opening 321 at an appropriate location above the source/drain electrode 3075 to expose a portion of the source/drain electrode 3075. Of course, depending on the requirements in practical applications, other processes, steps or execution sequences may also be used to form the patterned passivation layer 309. The patterned passivation layer 309 may be made of silicon nitride or other materials.

Finally, referring to FIG. 3M and FIG. 3N in which FIG. 3M is a top view of FIG. 3N, a patterned transparent conductive layer 311 is formed. The patterned transparent conductive layer 311 has two portions, in which one is electrically connected to the source/drain electrode 3075 via the third opening 321 and the other one is electrically connected to the upper gate pad 3073 via the second opening 317. The one electrically connected to the source/drain electrode 3075 is also called a pixel electrode. The transparent conductive material is applied onto the entire surface typically through a sputtering process. Then unnecessary portion of conductive material is removed through lithography and etching processes to form the patterned conductive layer 311. Of course, depending on requirements in practical applications, other processes may also be used to form the patterned transparent conductive layer 311. The patterned transparent conductive layer 311 may be made of indium tin oxide or other materials. It is noted that the pixel electrode partially overlaps the shielding common electrode line 3071 parallel to and covering the first data line segment 3031 to form a storage capacitor.

In this embodiment, the problem of the parasitic capacitor Cpd is solved by the shielding common electrode line without impacting on the aperture ration or rendering the manufacturing process complex. Moreover, the method of this embodiment only utilizes five photo masks as the halftone mask is utilized. Thus, the production time and cost are further saved.

Figure 4A:
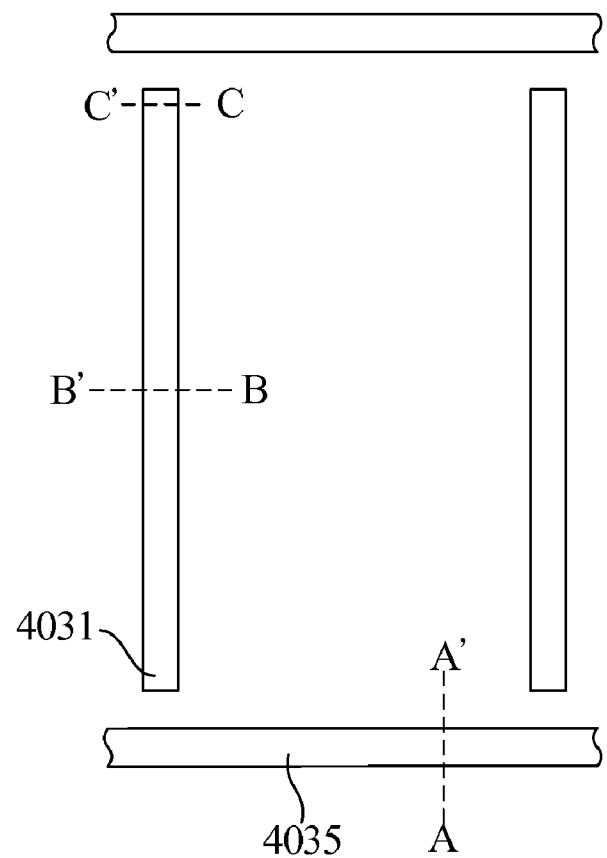
FIGS. 4A to 4L are schematic views of a manufacturing process in accordance with the second embodiment of this invention.
Figure 4B:
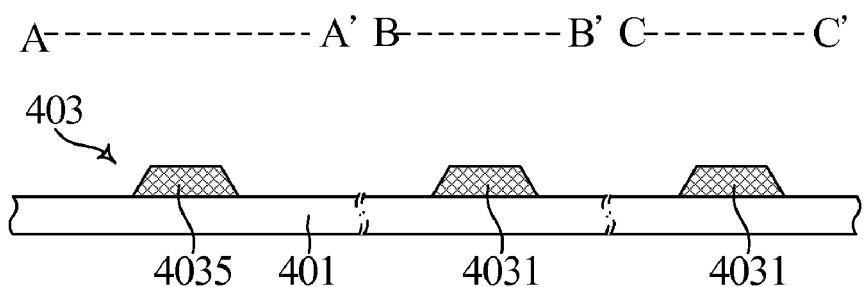

FIGS. 4A to 4L are schematic views of a second embodiment of this invention. FIG. 4A is a top view of FIG. 4B, while FIG. 4B is a schematic cross-sectional view taken along the lines AA', BB', and CC' in FIG. 4A. As may be appreciated by those of ordinary skill in the art, the steps of the first embodiment may also be applied to this embodiment, and thus some of corresponding descriptions will be omitted as appropriate in this embodiment. First, as shown in FIG. 4B, the patterned first metal layer 403 is formed on a substrate 401. The patterned first metal layer 403 comprises a first data line segment 4031 and a gate line 4035.

Figure 4C:
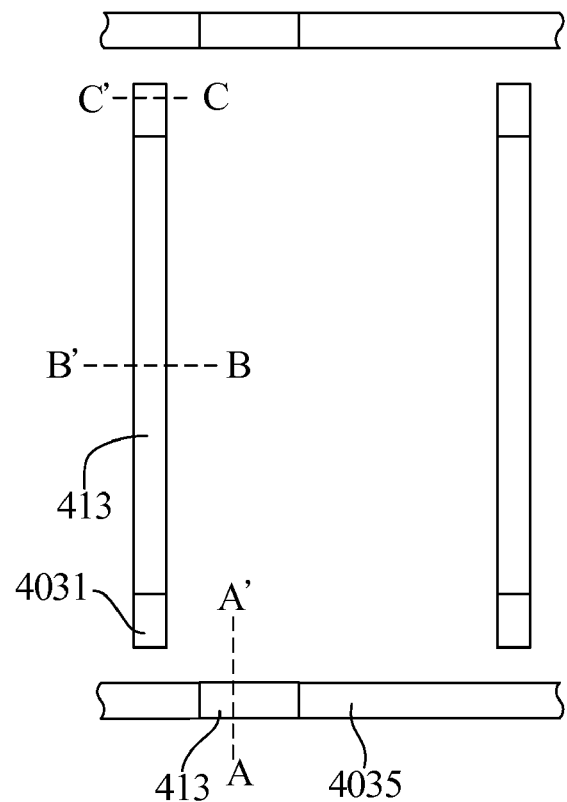
Figure 4D:
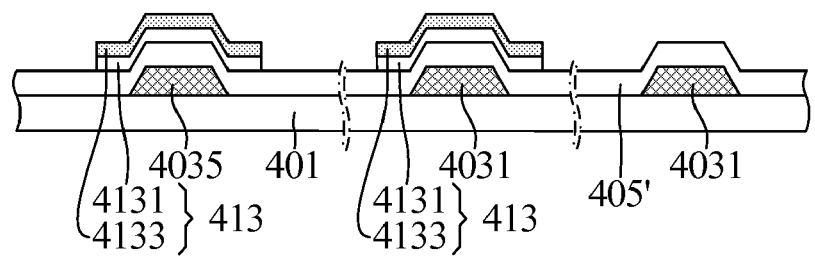

Next, as shown in FIG. 4C and FIG. 4D in which FIG. 4C is a top view of FIG. 4D, a dielectric layer 405' is formed. Afterwards, a patterned semiconductor layer 413 is formed above the portions of the first data line segment 4031 and the gate line 4035. The patterned semiconductor layer 413 comprises a patterned first semiconductor layer 4131 and a patterned second semiconductor layer 4133. The patterned first semiconductor layer 4131 may be an amorphous-silicon layer, and the patterned second semiconductor layer 4133 may be an N-type ion heavily doped amorphous-silicon layer, although they are not merely limited thereto. The patterned semiconductor layer 413 is formed by (but is not limited to) the following steps: a first semiconductor layer is formed widely on the dielectric layer 405', followed by formation of a second semiconductor layer on the first semiconductor layer, and then lithography and etching processes are performed to pattern the first semiconductor layer and the second semiconductor layer simultaneously, thus forming the patterned semiconductor layer 413. Alternatively, the patterned first semiconductor layer 4131 and the patterned second semiconductor layer 4133 may also be formed respectively to form the patterned semiconductor layer 413.

Figure 4E:
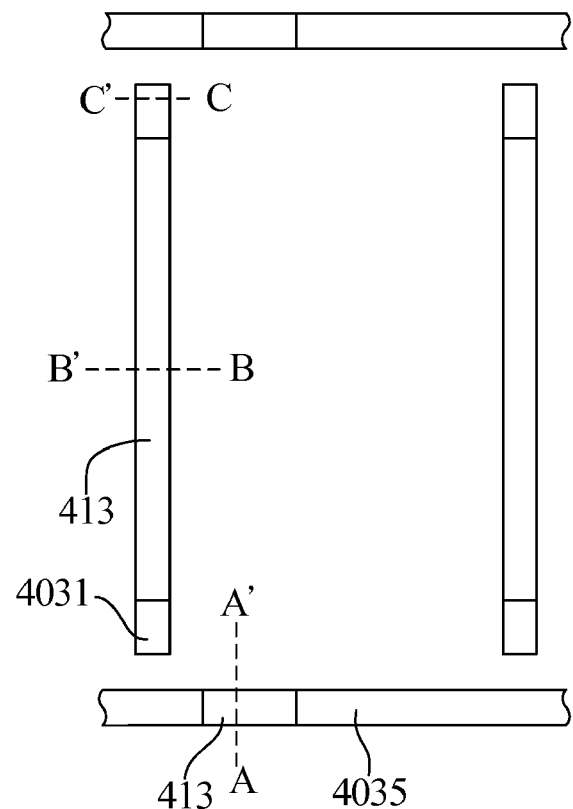
Figure 4F:
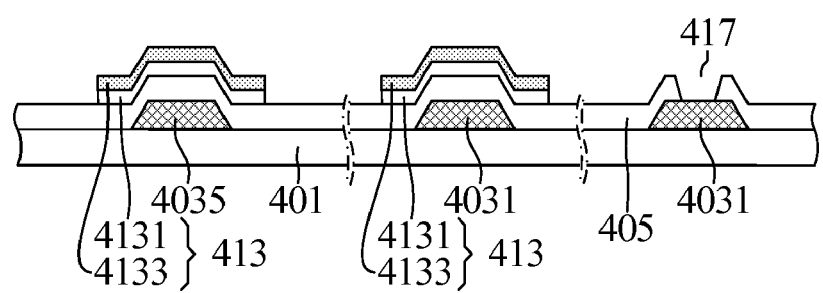
Figure 4G:
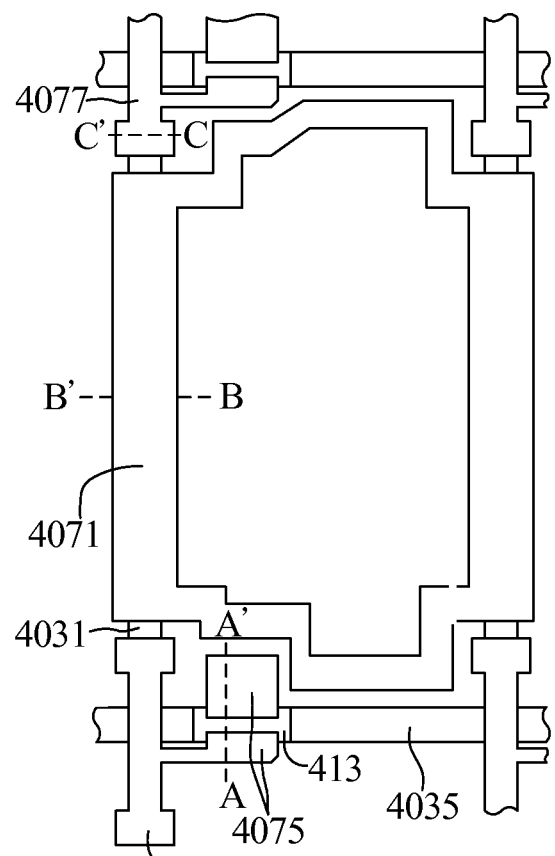
Figure 4H:
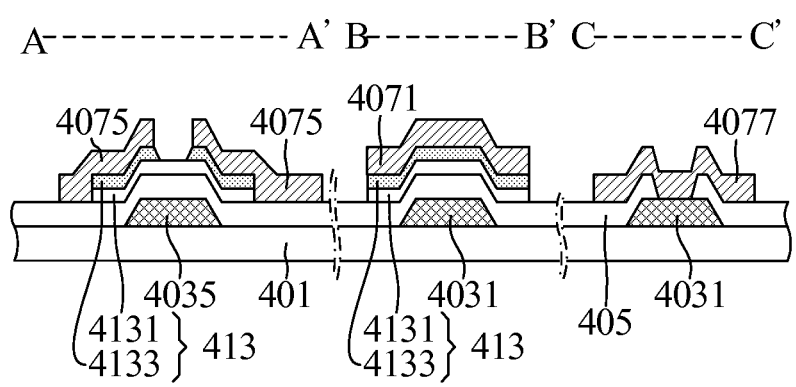

Next, as shown in FIG. 4E and FIG. 4F in which FIG. 4E is a top view of FIG. 4F, portions of the dielectric layer 405' is removed to form the patterned dielectric layer 405, including the formation of a plurality of first openings 417 in the dielectric layer 405' above the terminals of the first data line segment 4031. Next, as shown in FIG. 4G and FIG. 4H in which FIG. 4G is a top view of FIG. 4H, a second data line segment 4077, a common electrode line 4071 and a source/drain electrode 4075 are formed respectively on the first data line segment 4031 within the first opening 417, the patterned second semiconductor layer 4133 above the portion of the data line segment 4031 and the patterned second semiconductor layer 4133 above the gate line 4035. The second data line segment 4077 is electrically connected with the first data line segment 4031 via the first openings 417, and the source/drain electrode 4075 is electrically connected with the patterned second semiconductor layer 4133 above the gate line 4035.

Figure 4I:
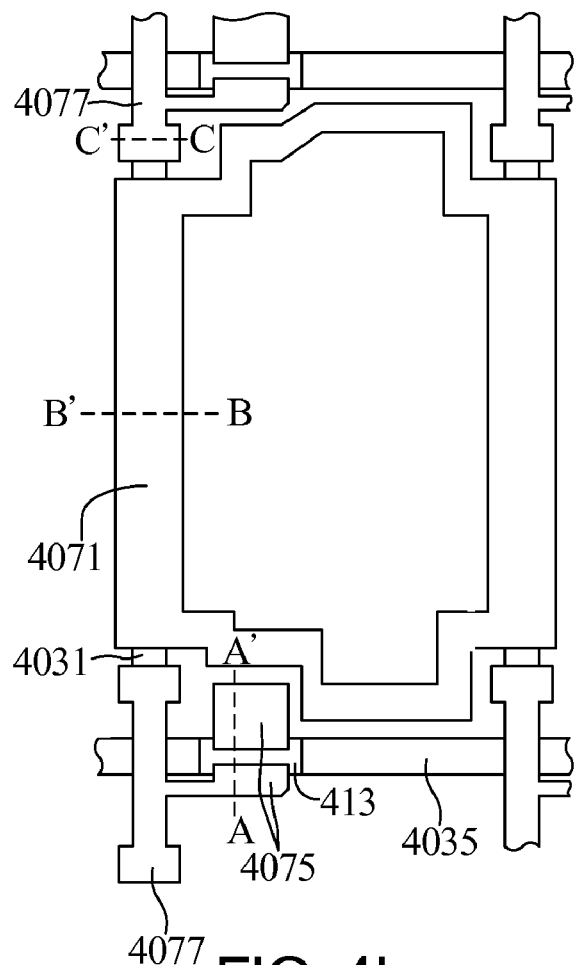
Figure 4J:
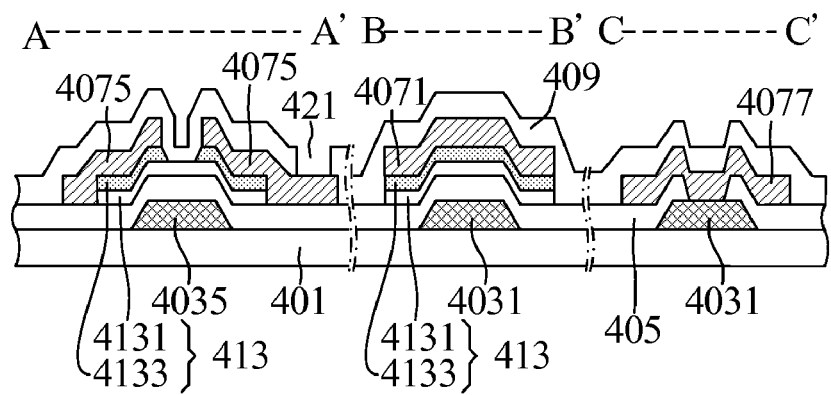
Figure 4K:
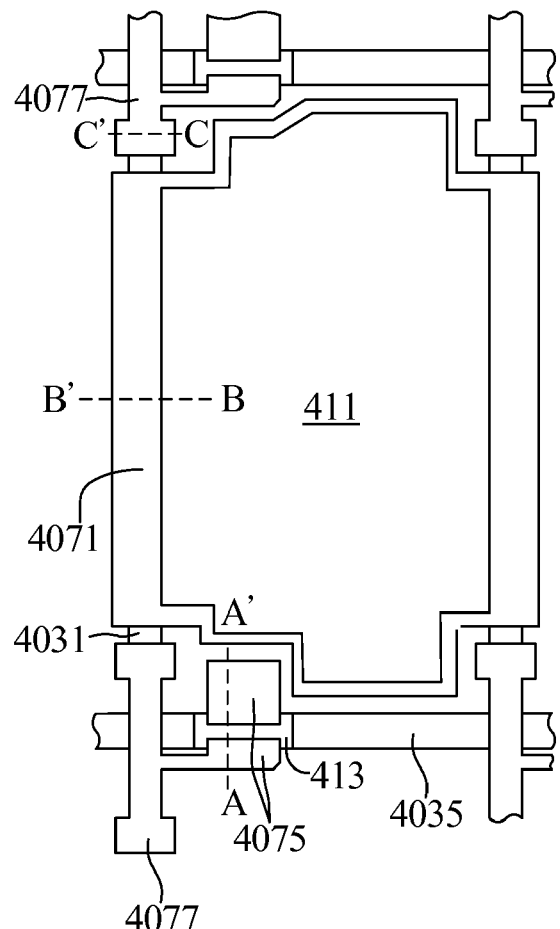
Figure 4L:
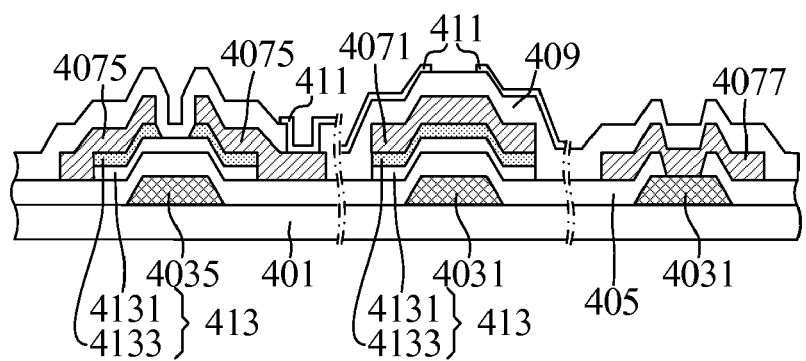

Next, as shown in FIG. 4I and FIG. 4J in which FIG. 4I is a top view of FIG. 4J, a patterned passivation layer 409 is formed, and a second opening 421 is formed at an appropriate location above the source/drain electrode 4075 to expose a portion of the source/drain electrode 4075. The passivation layer 409 may be made of silicon nitride or other materials. Finally, in reference to FIG. 4K and FIG. 4L in which FIG. 4K is a top view of FIG. 4L, a patterned transparent conductive layer 411 is formed. The patterned transparent conductive layer 411 is electrically connected to the source/drain electrode 4075 via the second opening 421. The patterned transparent conductive layer 411 may be made of indium tin oxide or other materials.

Figure 5A:
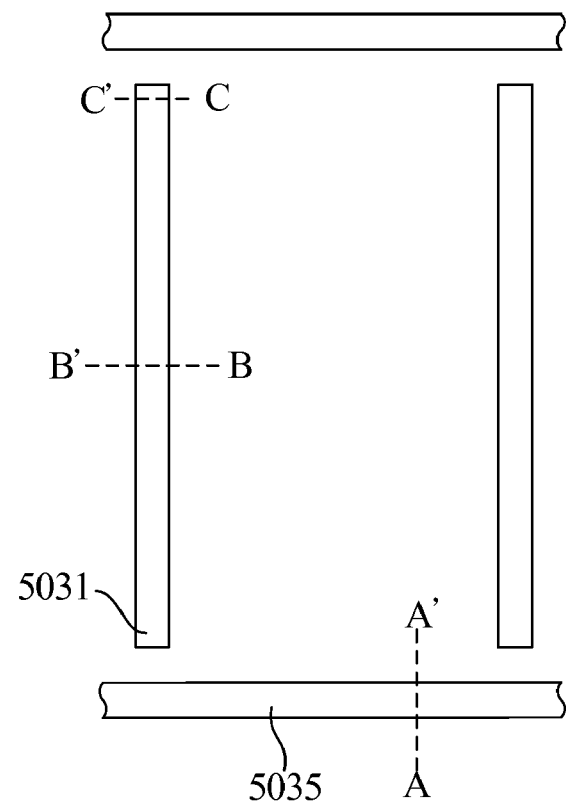
FIGS. 5A to 5L are schematic views of a manufacturing process in accordance with the third embodiment of this invention.
Figure 5B:
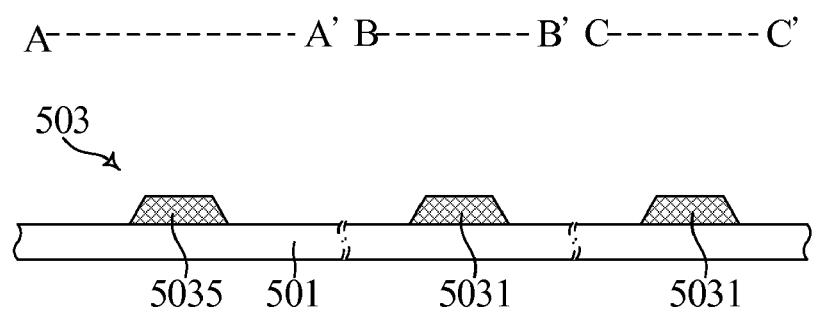

FIGS. 5A to 5L are schematic views of another embodiment of this invention. FIG. 5A is a top view of FIG. 5B. FIG. 5B is a schematic cross-sectional view taken along the lines AA', BB', and CC' in FIG. 5A. As may be appreciated by those of ordinary skill in the art, the steps of the first embodiment may also be applied to this embodiment, and thus some of corresponding descriptions will be omitted as appropriate in this embodiment. First, as shown in FIG. 5B, a patterned first metal layer 503 is formed on a substrate 501. The patterned first metal layer 503 comprises a first data line segment 5031 and a gate line 5035.

Figure 5C:
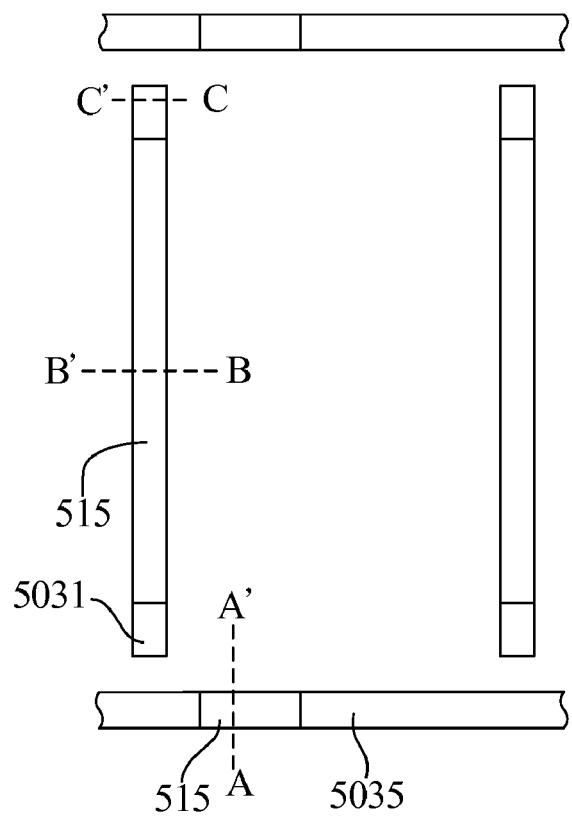
Figure 5D:
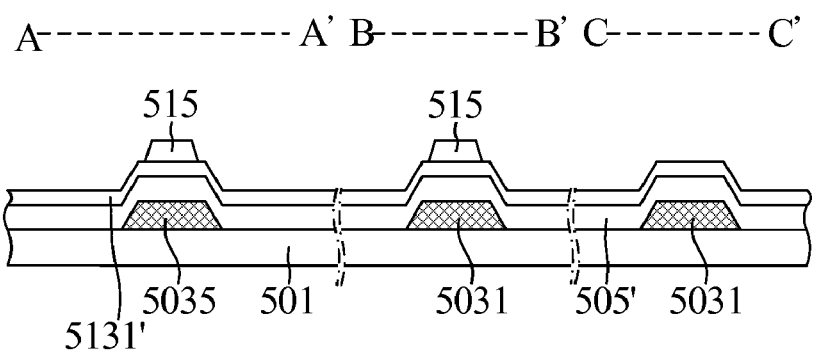
Figure 5E:
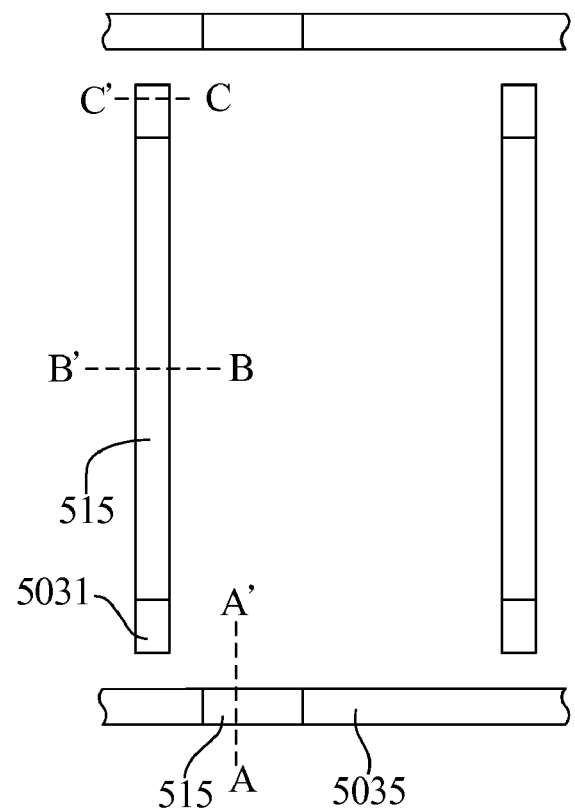
Figure 5F:
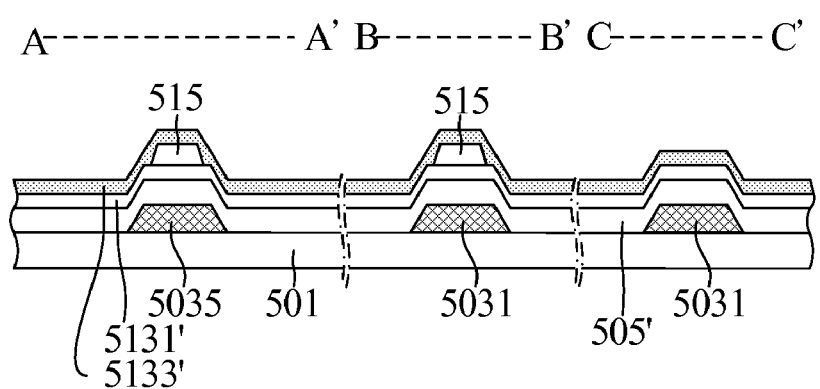

Next, as shown in FIG. 5C and FIG. 5D in which FIG. 5C is a top view of FIG. 5D, a dielectric layer 505' is formed. Afterwards, a first semiconductor layer 5131' is formed. Subsequently, an etch stop layer 515 is formed above the portions of the first data line segment 5031 and the gate line 5035. In reference to FIG. 5E and FIG. 5F in which FIG. 5E is a top view of FIG. 5F, a second semiconductor layer 5133' is formed on the first semiconductor layer 5131' and the etch stop layer 515. The first semiconductor layer 5131' may be an amorphous-silicon layer, the second semiconductor layer 5133' may be an N-type ion heavily doped amorphous-silicon layer, and the etch stop layer 515 may be made of a material selected from the group consisting of silicon nitride, silicon oxide, silicon oxynitride, and an organic material.

Figure 5G:
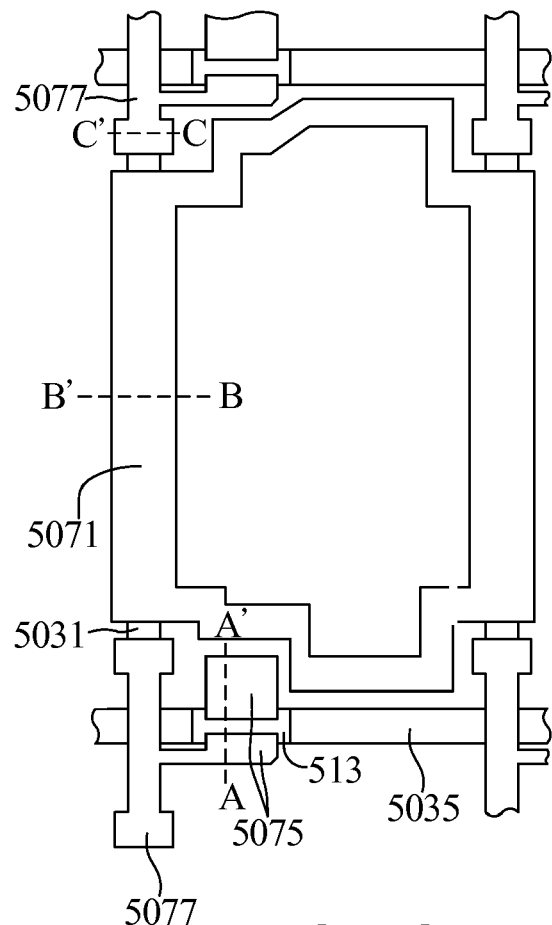
Figure 5H:
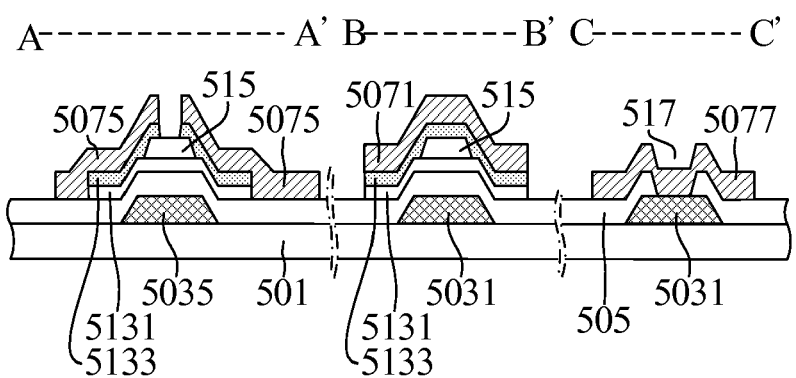

Next, as shown in FIG. 5G and FIG. 5H in which FIG. 5G is a top view of FIG. 5H, the dielectric layer 505', the first semiconductor layer 5131' and the second semiconductor layer 5133' are etched to form a patterned dielectric layer 505, a patterned first semiconductor layer 5131 and a patterned second semiconductor layer 5133. Meanwhile, a plurality of first openings 517 are defined in the dielectric layer 505' to expose the terminals of the first data line segment 5031. Then, a second data line segment 5077 is formed in the first opening 517, a common electrode line 5071 is formed above a portion of the first data line segment 5031, and a source/drain electrode 5075 is formed on the patterned second semiconductor layer 5133 above the gate line 5035 simultaneously. The second data line segment 5077 is electrically connected with the first data line segment 5031 via the first openings 517, and the source/drain electrode 5075 is electrically connected with the patterned second semiconductor layer 5133 above the gate line 5035.

Figure 5I:
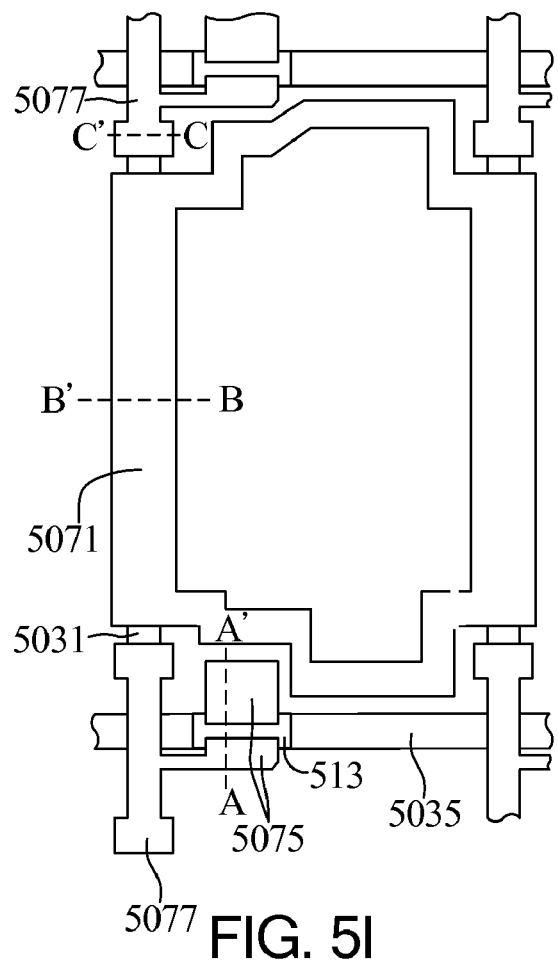
Figure 5J:
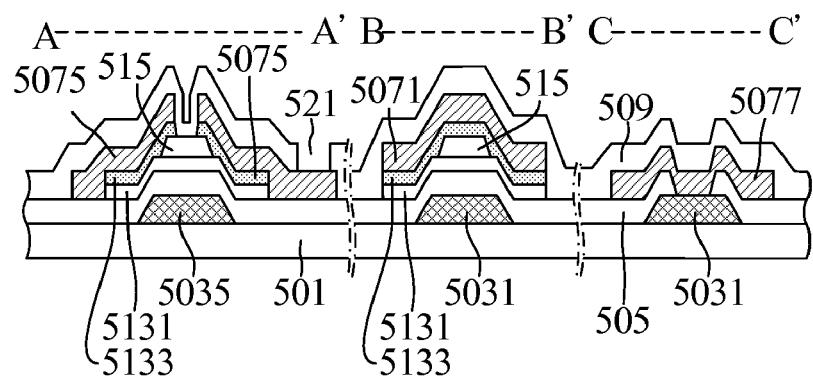
Figure 5K:
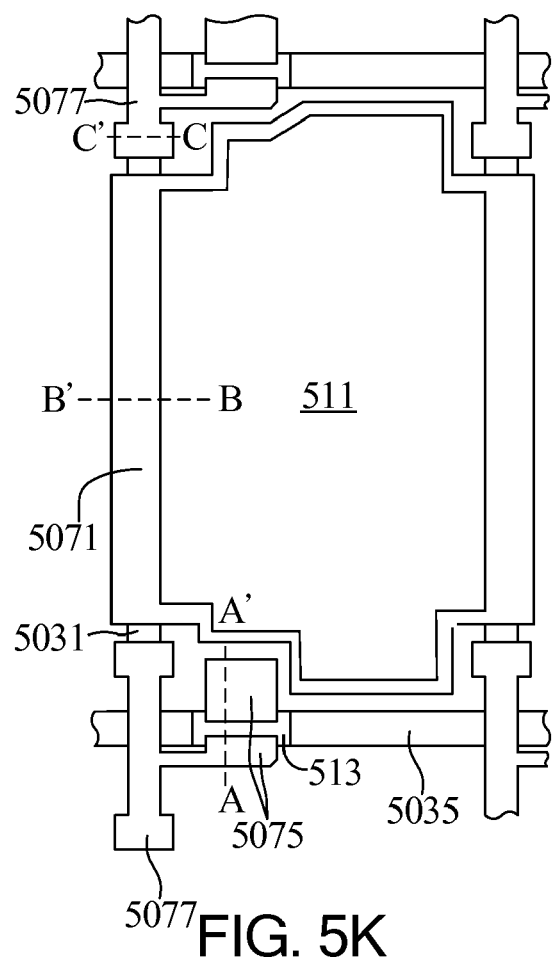
Figure 5L:
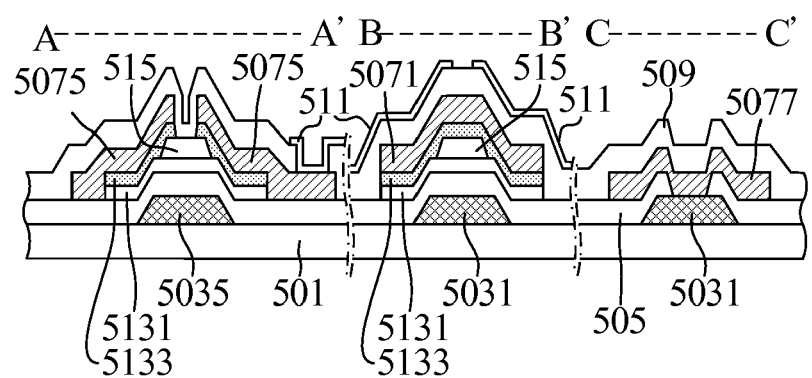

Next, in reference to FIG. 5I and FIG. 5J in which FIG. 5I is a top view of FIG. 5J, a patterned passivation layer 509 is formed, and a second opening 521 is formed at an appropriate location above the source/drain electrode 5075 to expose a portion of the source/drain electrode 5075. The passivation layer 509 may be made of silicon nitride or other materials. Finally, as shown in FIG. 5K and FIG. 5L in which FIG. 5K is a top view of FIG. 5L, a patterned transparent conductive layer 511 is formed. The patterned transparent conductive layer 511 is electrically connected to the source/drain electrode 5075 via the second opening 521. The patterned transparent conductive layer 511 may be made of indium tin oxide or other materials.

In conclusion, this invention solves the problems related to the effects of a parasitic capacitor Cpd by forming the common electrode above a portion of the data line in manufacturing a liquid crystal display unit. If a half-tone mask is adopted for the lithography process, this invention may further simplify the manufacturing process, and save both production time and cost. If the aforesaid semiconductor layer and/or etch stop layer are further provided between the patterned transparent conductive layer and the data line, this invention may further decrease the load of the data line when transmitting a signal. Therefore, this invention is of great value to the industry.

The above embodiments are not limited to what illustrated in the drawings, and various different aspects, processes, steps or execution sequences will readily occur to those of ordinary skill in the art upon reviewing the technical disclosure herein. For example, optionally, a dielectric layer may be further disposed between the patterned first semiconductor layer 3131 and the patterned second semiconductor layer 3133 in the first embodiment to serve as an etch stop layer, or a barrier layer may be disposed beneath the metal layers in these embodiments.

The above disclosure is related to the detailed technical contents and inventive features thereof People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A liquid crystal display unit structure formed on a substrate, comprising:
   a patterned first conductive layer, including a first data line segment and a gate line, formed on the substrate;
   a dielectric layer, covering the first data line segment and the gate line, the dielectric layer having at least two first openings exposing two terminals of the first data line segment;
   a patterned first semiconductor layer, formed on the dielectric layer, the patterned first semiconductor layer including at least a portion located above the gate line;
   a patterned etch stop layer, having a first portion and a second portion, the first portion of the patterned etch stop layer being located above the first data line segment, the second portion of the patterned etch stop layer being located on the patterned first semiconductor layer above the gate line;
   a patterned second conductive layer, including a source electrode, a drain electrode, a second data line segment and a common electrode line, wherein the second data line segment is electrically connected to the first data line segment via the first openings and the common electrode line has a portion substantially covering the first portion of the patterned etch stop layer located above the first data line segment, and wherein the source electrode and the drain electrode are located on two sides of the second portion of the patterned etch stop layer and the patterned first semiconductor layer, and the source electrode and the drain electrode are electrically connected to the patterned first semiconductor layer;
   a patterned passivation layer, covering the source electrode, the drain electrode, the second data line segment and the common electrode line; and
   a patterned transparent conductive layer, formed on the patterned passivation layer and electrically connected to the drain electrode.

2. The structure as claimed in claim 1, wherein the patterned first conductive layer includes a patterned first metal layer.

3. The structure as claimed in claim 1, wherein the patterned second conductive layer includes a patterned second metal layer.

4. The structure as claimed in claim 1, wherein the patterned first semiconductor layer includes an amorphous silicon layer.

5. The structure as claimed in claim 1, wherein further comprising a patterned second semiconductor layer located between the source electrode, the drain electrode and the patterned first semiconductor layer.

6. The structure as claimed in claim 5, wherein the patterned second semiconductor layer includes an N-type ion heavily doped amorphous silicon layer.

7. The structure as claimed in claim 1, wherein a material of the etch stop layer is selected from the group consisting of silicon nitride, silicon oxide, silicon oxynitride, and organic material.

8. The structure as claimed in claim 1, wherein the patterned passivation layer comprises a silicon nitride layer.

9. The structure as claimed in claim 1, wherein the patterned transparent conductive layer comprises an indium tin oxide (ITO) layer.

10. A liquid crystal display unit structure formed on a substrate, comprising:

a first data line segment, formed on the substrate;

a gate line, formed on the substrate;

a dielectric layer, covering the first data line segment and the gate line, the dielectric layer having at least two first openings exposing two terminals of the first data line segment;

a patterned first semiconductor layer, formed on the dielectric layer, the patterned first semiconductor layer including at least a portion located above the gate line;

a patterned etch stop layer, having a first portion and a second portion, the first portion of the patterned etch stop layer being located above the first data line segment, the second portion of the patterned etch stop layer being located on the patterned first semiconductor layer above the gate line;

a source electrode and a drain electrode, formed on two sides of the second portion of the patterned etch stop layer and the patterned first semiconductor layer, and electrically connected to the patterned first semiconductor layer;

a second data line segment, electrically connected to the first data line segment via the first openings;

a common electrode line, having a portion substantially covering the first portion of the patterned etch stop layer located above the first data line segment;

a patterned passivation layer, covering the source electrode, the drain electrode, the second data line segment and the common electrode line; and a patterned transparent conductive layer, formed on the patterned passivation layer and electrically connected to the drain electrode.

* * * * *